United States Patent
Camuffo et al.

(10) Patent No.: US 7,724,086 B2
(45) Date of Patent: May 25, 2010

(54) APPARATUS AND METHOD FOR REGULATING THE OUTPUT POWER OF AN AMPLIFIER STAGE

(75) Inventors: Andrea Camuffo, Munich (DE); Guenter Maerzinger, Linz (AT); Michael Meixner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/840,260

(22) Filed: Aug. 17, 2007

(65) Prior Publication Data

US 2008/0042750 A1 Feb. 21, 2008

(30) Foreign Application Priority Data

Aug. 17, 2006 (DE) .................. 10 2006 038 410

(51) Int. Cl.
*H03G 3/20* (2006.01)
(52) U.S. Cl. .................. 330/129; 330/279
(58) Field of Classification Search .......... 330/129, 330/278, 279
See application file for complete search history.

(56) References Cited

U.S. PATENT DOCUMENTS

| | | | | | |
|---|---|---|---|---|---|
| 4,360,787 | A | * | 11/1982 | Galpin | 330/284 |
| 4,546,326 | A | * | 10/1985 | Van Uffelen et al. | 330/129 |
| 5,128,629 | A | * | 7/1992 | Trinh | 330/129 |
| 5,208,550 | A | * | 5/1993 | Iwane | 330/129 |
| 5,304,947 | A | * | 4/1994 | Carlsson | 330/279 |
| 5,752,171 | A | * | 5/1998 | Akiya | 455/126 |
| 2007/0153937 | A1 | | 7/2007 | Itkin et al. | |

OTHER PUBLICATIONS

ETSI TS 125 101 V7.2.0 (Dec. 2005) Universal Mobile Telecommunications System (UMTS); User Equipment (UE) radio transmission and reception (FDD); (3GPP TS 25.101 version 7.2.0 Release 7); pp. 16-19.

* cited by examiner

*Primary Examiner*—Henry K Choe
(74) *Attorney, Agent, or Firm*—SpryIP, LLC

(57) ABSTRACT

The present invention relates to a device and a method for regulating the output power of an amplifier stage, e.g. an amplifier stage in a mobile data transmission system.

12 Claims, 2 Drawing Sheets

US 7,724,086 B2

APPARATUS AND METHOD FOR REGULATING THE OUTPUT POWER OF AN AMPLIFIER STAGE

RELATED APPLICATION INFORMATION

This application claims priority to German Patent Application DE 10 2006 038 410.5 filed on Aug. 17, 2006.

FIELD OF THE INVENTION

The present invention relates to an apparatus and a method for regulating the output power of an amplifier stage, e.g. an amplifier stage in a mobile data transmission system.

BACKGROUND

Regulation of the output power of an amplifier stage is subject to predefined requirements, particularly in data transmission systems. Thus, e.g., in the UMTS standard (Universal Mobile Telecommunication System), a modification of the output power of a transmitter in a mobile terminal device is prescribed [1]. This is required, because a poor or incorrect setting of the output power would influence other connections over the same channel or reduce their transmission quality. In a communication system, a base station therefore regularly, e.g. at a rate of 1.5 kHz, transmits commands that specify corrections for the output power values to the mobile terminal device. These corrections may lie in orders of magnitude of −3 dB to +3 dB. It is required that a mobile terminal device follows these commands and maintains predefined tolerances so as not to affect its own transmission quality and the transmission quality of other mobile terminal devices transmitting on a same channel. In comparison, the entire dynamic range of a UMTS data transmission system is more than 70 dB.

It is known for an "open-loop" approach to be adopted in the mobile terminal device. The output power in the mobile terminal device is not monitored directly, but merely modifications to the output power are carried out according to correction signals sent by the base station.

A "closed-loop" approach may be adopted due to more stringent requirements from network operators in terms of the equivalent radiated output power of mobile terminal devices. In the closed-loop approach, a feedback loop is provided within the mobile terminal device, by means of which the output power of the amplifier stage is monitored. The output power is regulated according to a output power measured in the mobile terminal device. E.g., a closed-loop approach may be applied in order to guarantee the quality of the mobile terminal devices in the event of a mismatching of antennas. At the same time, it is ensured that the maximum output power specified in the standard is not exceeded.

SUMMARY

According to one embodiment of the invention, an apparatus for regulating the output power of an amplifier stage includes a power detector to sense an output power value of the amplifier stage. A regulating unit, which is set up to generate a power correction signal depending on the output power value, connects to the power detector. A limiter connects to the regulating unit. The limiter is disposed for limiting a value of the power correction signal depending on a control signal, which indicates a regulating range of the amplifier stage.

According to one embodiment of the invention, a method embodiment for regulating the output power of an amplifier stage comprises:

sensing an output power value of the amplifier stage;
defining a power correction signal depending on the output power value;
defining a regulating range of the amplifier stage; and
limiting a value of the power correction signal depending on the regulating range.

BRIEF DESCRIPTION OF THE DRAWINGS

The accompanying drawings are included to provide a further understanding of the invention, are incorporated in, and constitute a part of this specification. The drawings illustrate the embodiments of the invention and together with the description serve to explain the principles of the invention. Other embodiments of the invention and many of the intended advantages of the invention will be readily appreciated, as they become better understood by reference to the following description. Like reference numerals designate corresponding similar parts.

DETAILED DESCRIPTION

Figure 1:
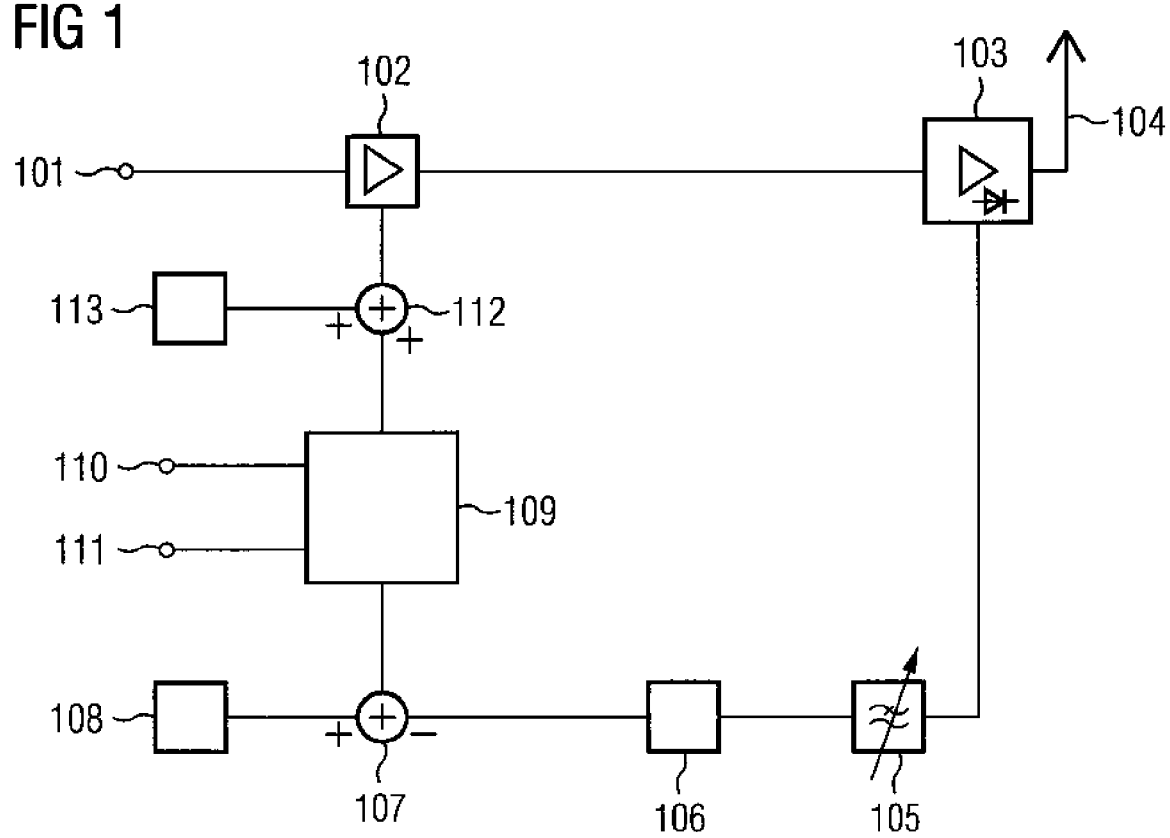
FIG. 1 illustrates an amplifier stage with an apparatus embodiment for regulating the output power of the amplifier stage.

FIG. 1 illustrates an amplifier stage with an apparatus embodiment for regulating the output power of the amplifier stage. The amplifier stage has a first input 101 for feeding a transmission signal to be amplified into the amplifier stage. E.g. The transmission signal may be an output signal of a mobile terminal device, i.e. a radio frequency data signal.

The first input 101 connects to a digitally adjustable amplifier 102 in order to feed the transmission signal to be amplified to the latter. The digitally adjustable amplifier 102 connects on the output side to an input of a power output amplifier 103. The transmission signal is amplified to a final output power value. The power output amplifier 103 connects on the output side to a transmission means, which, in the embodiment shown, is an antenna 104. However, other transmission means, e.g. a line input, i.e. a copper wire or an optical fibre or other transmission means, such as a laser, an LED, etc., are similarly conceivable.

The transmission signal injected at the first input 101 is transmitted via the antenna 104 with an output power set jointly by the digitally adjustable amplifier 102 and the power output amplifier 103.

The output power of the transmission signal is sensed in the power output amplifier 103. This is done, e.g., by means of a diode or by means of a coupling element. The power output amplifier 103 connects via a feedback line 104 to a low-pass filter 105. The limit frequency of the low-pass filter 105 is adjustable. The low-pass filter 105 connects on the output side to an analogue-digital converter 106. The analogue-digital converter 106 generates a digital control word corresponding to an output power value that was sensed in the power output amplifier 103.

The analogue-digital converter 106 connects to a first subtractor 107, to which it feeds the digital control word. A reference control word, which is provided by a reference unit 108, is furthermore fed to the first subtractor 107. The first subtractor 107 forms the difference between the digital control word and the reference control word. This difference corresponds to a power correction signal. The power correction signal indicates the extent to which the output power that was sensed on the power output amplifier 103 differs from a reference value given by the reference control word. The power correction signal is fed to a limiter 109, which connects to the first subtractor 107. The limiter 109 has a second input 110 and a third input 111. A control signal, which indicates a regulating range for the amplifier stage to the limitation unit, is fed via the second input 110 to the limiter 109.

The control signal may be generated externally and may correspond to an operating condition of the transmission device in which the amplifier stage may be arranged. A control signal, by means of which an amplification factor is set for the power correction signal, is fed via the third input 111 to the limiter 109. The limiter 109 limits the value of the power correction signal upwards or downwards. The power correction signal limited in this way is fed to a first adder 112, which connects on the input side to the limiter 109. Furthermore, a power-setting signal is fed on the input side from a controllable amplification control unit 113 to the first adder 112.

In the first adder 112, the power correction signal and the power-setting signal are combined, i.e. added, in order to generate a power control signal. The power control signal is fed from the first adder 112 to the digitally adjustable amplifier 102. To this end, the first adder 112 and the digitally adjustable amplifier 102 are connected by means of a line.

One embodiment is disposed to generate a power correction signal which may be used to regulate the amplifier stage and which is limited in its value, i.e. in its maximum or minimum value. The limitation of the value of the power correction signal is defined by a regulating range of the amplifier stage. As a result, a modification of the output power can only be carried out depending on the regulating range of the amplifier stage within a range predefined by the limitation. In particular, an excessive jump in the output power of the amplifier stage may be prevented if a corresponding regulating range of the amplifier stage is indicated by the control signal. A discontinuity in the regulation of the amplifier stage can therefore be prevented with the device and method according to the invention, if, e.g., a mobile terminal device which has the amplifier stage switches over from an open-loop regulating range to a closed-loop regulating range.

In one embodiment, the device has a power control input to feed a power-setting signal. A combiner connects to the regulating unit and to the power control input to combine the power correction signal and the power-setting signal into a power control signal, which may be fed to the amplifier stage. A combination of the power correction signal with the power-setting signal enables not only the limited power correction signal, but also a further freely selectable power-setting signal to be used to regulate the output power of the amplifier stage. It is thus possible, e.g., if the device is used in a mobile terminal device, for a closed-loop regulation of the amplifier stage to be carried out by the power correction signal, whereas an open-loop regulation of the amplifier stage is effected by the power-setting signal. A continuous transition from an open-loop regulation of the amplifier stage to a closed-loop regulation of the amplifier stage is therefore carried out through the limitation of the power correction signal.

In one embodiment, the combiner is an adder, which adds the power correction signal and the power-setting signal to form the power control signal.

In one embodiment, the amplifier structure has an amplifier which may be adjusted by means of a digital control word to an amplification factor. It is thus possible to design the power control signal as a digital signal, and to feed said signal directly to the amplifier stage without carrying out a digital-analogue conversion of the power-setting signal. The digitally adjustable amplifier can serve, e.g., as a preliminary stage to an analogue amplifier. It is similarly conceivable for an individual, digitally adjustable amplifier to be provided in the amplifier stage.

In one embodiment, the regulating unit has a comparison unit which is disposed for comparing the output power value with a reference value. A comparison unit of this type may, e.g., be a subtraction unit. The regulating unit thus enables adaptation of the output power value to a predefined reference value. Various devices, such as a baseband chip, may predefine said reference value.

In one embodiment, the limiter has a limit value stage for a limitation of the size of the output power value. In a different embodiment, the limiter has a limit value stage for a limitation of the size of the reference value.

Figure 2:
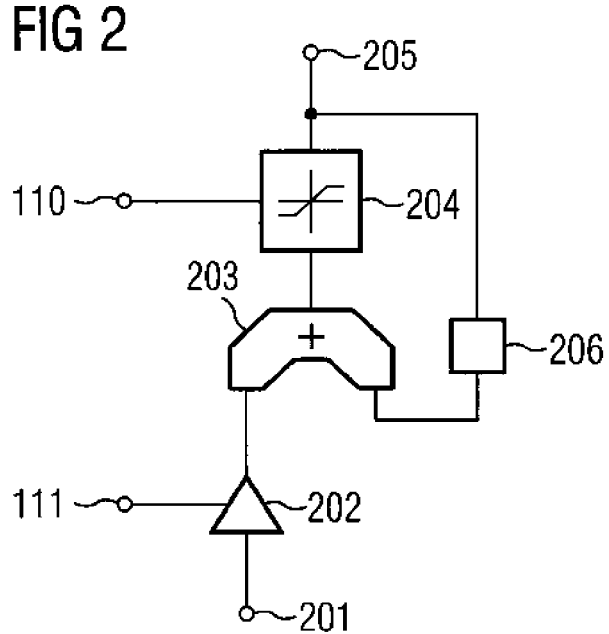
FIG. 2 illustrates a limiter for use in an apparatus embodiment for regulating the output power of an amplifier stage.

FIG. 2 illustrates a limiter for use in an apparatus embodiment for regulating the output power of an amplifier stage, e.g., as a limiter 109 in the example embodiment shown in FIG. 1.

The limiter shown in FIG. 2 has a fourth input 201, which connects, e.g., to the first subtractor 107 shown in FIG. 1. The power correction signal is fed via the fourth input 201 to the limitation unit. The fourth input 201 connects to an amplifier 202 which amplifies the power correction signal. A signal attenuation caused in the feedback path is compensated by means of the amplifier 202. The amplification gain of the amplifier 202 may be adjusted for this purpose. To adjust the amplification gain, the amplifier 202 connects to the third input 111 in order to feed a gain control signal to it. The amplifier 202 connects on the output side to a second adder 203. The second adder 203 connects on the output side to a limiter 204. The limiter 204 is a device which limits the output signal of the second adder 203 to a maximum value and a minimum value, i.e. by means of a limit value. The limit value is set by a control signal which is fed via the second input 110 to the limiter 204. An output signal of the limiter 204 is provided at an output 205 of the limitation unit. The output signal corresponds to a limited power correction signal. The limited power correction signal is forwarded via a feedback loop to a delay component 206, which connects on the output side to an input of the second adder 203.

The mode of operation of a device according to the invention is explained below by way of an example in a mobile terminal device of a UMTS data transmission system with reference to the example embodiments presented above.

A data transmission signal is transmitted via the transmission path, which comprises the first input 101, the digitally adjustable amplifier 102, the power output amplifier 103 and the antenna 104. The output power of the data transmission signal is defined by a first amplification factor of the digitally adjustable amplifier 102 and by a second amplification factor of the power output amplifier 103. The first amplification factor may be adjusted by a digital control word, so that the output power of the data transmission signal is regulated by the digital control word. The digital control word corresponds to the power control signal, which comprises the power correction signal and the power-setting signal.

The power correction signal arises from a closed-loop control, in which the equivalent output power is compared with a predefined reference value.

The power-setting signal arises from an open-loop control, in which the amplifier control unit 113 predefines the output power. The amplifier control unit 113 may, e.g., be disposed in a baseband-processing device, and may generate the power-setting signal on the basis of commands transmitted by a base station. The power-setting signal thus serves to indicate the required output power.

Through the combination of the power correction signal and the power-setting signal in the first adder 112, the second amplification factor is determined by both an open-loop control and a closed-loop control. Here, the influence of the closed-loop control is dependent on a setting of the limiter 109, which defines the maximum or minimum value of the power correction signal. The limiter 109 is, e.g., disposed that, in a first range, also referred to below by way of an example as the OPEN LOOP range, it completely suppresses the power correction signal, in a second range, also referred to below as the TRANSITIONAL range, partially restricts the absolute value of the power correction signal, and, in a third range, also referred to below as the CLOSED LOOP range, allows the power correction signal to pass completely. The ranges are defined by the control signal present at the second output 110. The control signal may, e.g., be generated in a baseband-processing device.

For UMTS, the ranges may be indicated by way of an example as follows:

| Regulating range | Output power |
| --- | --- |
| OPEN LOOP range | −50 dBm to −10 dBm |
| TRANSITIONAL range | −10 dBm to 10 dBm |
| CLOSED LOOP range | 10 dBm to 24 dBm |

It is assumed that the spectrum of the output power in UMTS ranges from −50 dBm to 24 dBm. A diode, which reliably operates above −10 dBm as a power detector, may serve to sense the output power.

Depending on the band, the maximum output powers lie between 21 dBm and 24 dBm. In band I, up to 33 dBm are even possible. The ranges are selected according to the entire spectrum of the output power and the characteristics of the power detector. For different transmission systems, or if a different power detector is used, a corresponding adaptation of the relevant range limit is carried out.

In the case of low output powers of the transmission path, the control signal is selected in such a way that the device lies within the OPEN LOOP range. The power correction signal is completely suppressed by the limiter 109. The power control signal corresponds to the power-setting signal, so that the first amplification factor is determined merely by the power-setting signal.

As soon as the output power rises and exceeds a specific limit value, the device switches into the TRANSITIONAL range. The control signal is set in such a way that the limiter 109 does not completely suppress the power correction signal, but merely limits its maximum value or minimum value. The extent of the limitation is dependent on the required output power. The lower the output power, the greater is the limitation. Consequently, the changes in the output power caused by the power correction signal remain small if the output powers are low. In other words: for low output powers, the correction is limited in the TRANSITIONAL range by a closed-loop control. The size of a correction window in which a closed-loop control takes place is gradually increased depending on the output power. The higher the required output power, the higher the maximum value or the lower the minimum value which limits the power correction signal. The power control signal is derived from the sum of the power correction signal and the power-setting signal. It is thus ensured by the limiter 109 that the power correction signal can only contribute to a small proportion of the power control signal.

Once a further limit of the output power has been exceeded, the limiter 109 is set by the control signal so that the power correction signal is completely transferred. Above this limit, the device is operated in the CLOSED LOOP range. The power correction signal furthermore comprises a combination of the power correction signal and the power-setting signal. The output power can essentially be defined by the reference control word which is provided by the reference unit 108. This reference control word is also referred to as the Wanted Detector Voltage.

As shown in FIG. 2, the limiter 109 may have an integrating accumulator, so that changes at the output 205 only take place slowly and without substantial jumps.

Figure 3:
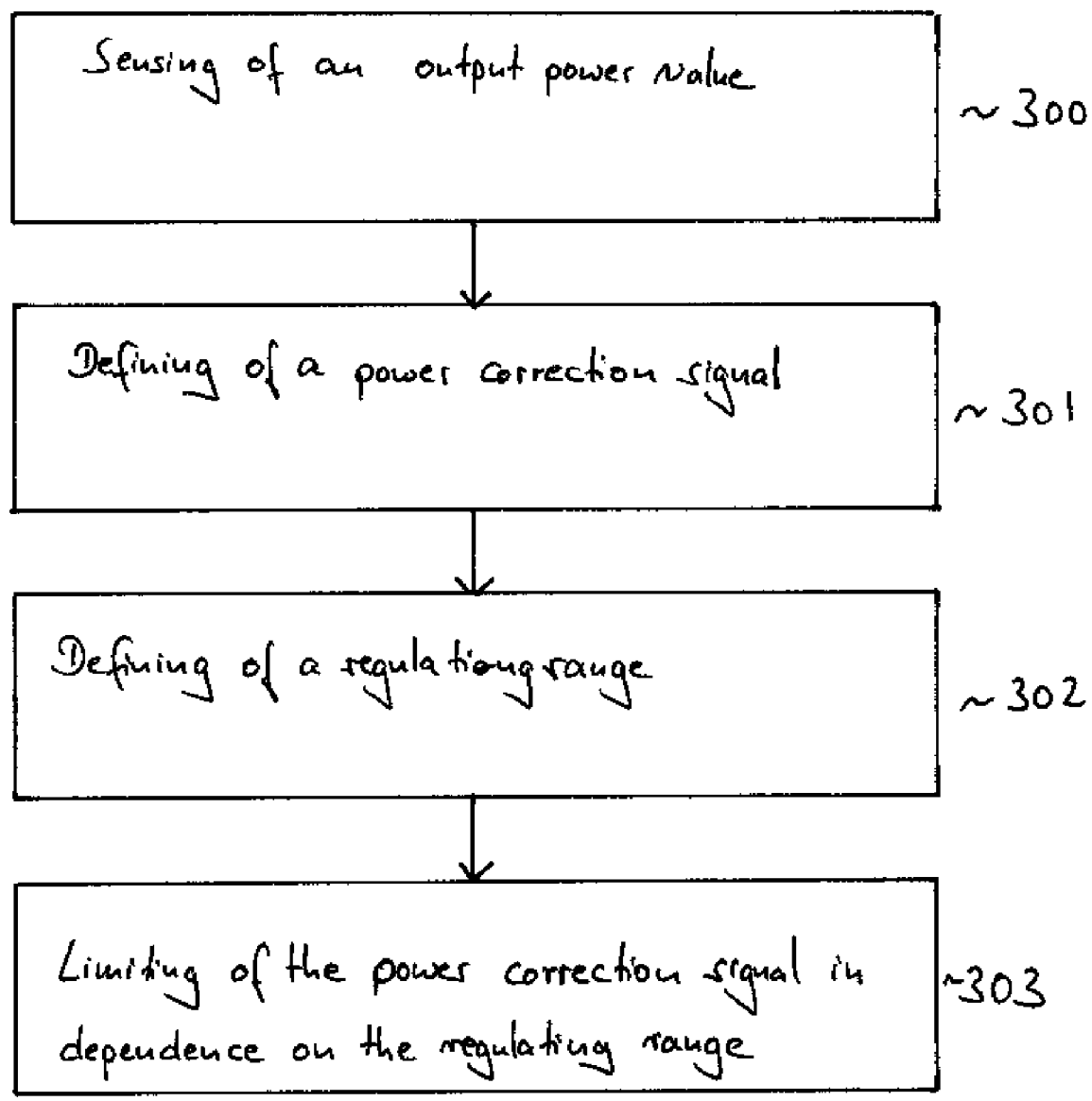
FIG. 3 illustrates an embodiment of a method for regulating the output power of an amplifier stage according to the invention.

FIG. 3 illustrates an embodiment of a method for regulating the output power of an amplifier stage according to the invention. The method comprises a first step 300 to perform a sensing of an output power value of the amplifier stage. In a second step 301, a power correction signal depending on the output power value is defined. In a third step 302, a regulating range of the amplifier stage is defined. In a fourth step 303 a value of the power correction signal is limited in dependence on the regulating range.

In one embodiment, the method further comprises the steps of feeding of a power-setting signal, and of combining of the power correction signal and the power-setting signal to form a power control signal.

In one embodiment, the method further comprises the step of feeding of the power control signal to the amplifier stage to set an amplification factor.

Although the invention has been shown and described with respect to a certain embodiments, equivalent alterations and modifications will occur to others skilled in the art upon the reading and understanding of this specification and the annexed drawings. E.g., although bipolar or CMOS technologies are used in various embodiments of the invention, in other embodiments, other disposed technologies may be used. In regard to the various functions performed by the above described components or circuits, terms used to describe such components are intended to correspond, unless otherwise indicated, to any component which performs the specified function of the described component (i.e., that is functionally equivalent), even though not structurally equivalent to the disclosed structure which performs the function in the exemplary embodiments of the invention. Terms such as "coupled" should be interpreted to mean either directly coupled or indirectly coupled. Terms such as "connected" should be interpreted to mean either directly connected or indirectly connected. Furthermore, to the extent that the term "includes" is used in either the detailed description or the claims, such term is intended to be inclusive in a manner similar to the term "comprising." While a particular feature of the invention may have been disclosed with respect to only one of several embodiments of the invention, such a feature may be combined with one or more other features of the other embodiments as may be desired and advantageous for any given or particular application.

The following publication is cited in the present document:
[1] ETSI TS 125 101 V 7.2.0 (2005-12); pages 16 to 19.

What is claimed is:

1. An apparatus for regulating the output power of an amplifier stage arranged in a transmission device comprising:
a power detector to sense an output power value of a transmission signal amplified by the amplifier stage;

a regulating unit connected to the power detector to generate a power correction signal depending on the output power value, the power correction signal being generated during a closed-loop regulation of the amplifier stage;

a limiter connected to the regulating unit to limit a value of the power correction signal depending on a control signal which indicates a regulating range of the amplifier stage according to an operating condition of the transmission device; and a power control input for feeding a power-setting signal, the power-setting signal being generated during an open-loop regulation of the amplifier stage.

2. An apparatus according to claim 1 comprising:

a combiner connected to the regulating unit to combine the power correction signal and the power-setting signal to form a control signal which may be fed to the amplifier stage.

3. An apparatus according to claim 2, wherein the combiner is an adder.

4. An apparatus according to claim 1, wherein the amplifier stage includes an amplifier whose amplification factor may be adjusted by a digital control word.

5. An apparatus according to claim 1, wherein the regulating unit includes a comparison unit to compare the output value with a reference value.

6. An apparatus according to claim 5, wherein the limiter includes a limit value stage for a limitation of the value of the power correction signal.

7. An apparatus according to claim 5, wherein the limiter includes a limit value stage for a limitation of the size of the reference value.

8. A method for regulating the output power of an amplifier stage arranged in a transmission device comprising:

sensing of an output power value of a transmission signal amplified by the amplifier stage;

defining of a power correction signal depending on the output power value, the defining of the power correction signal to occur during a closed-loop regulation of the amplifier stage;

defining of a regulating range of the amplifier stage, limiting of a value of the power correction signal depending on the regulating range according to an operating condition of the transmission device; and feeding of a power-setting signal, the feeding of the power-setting signal to occur during an open-loop regulation of the amplifier stage.

9. A method according to claim 8 comprising:

combining of the power correction signal and the power-setting signal to form a power control signal.

10. A method according to claim 9 comprising:

feeding of the power control signal to the amplifier stage to set an amplification factor.

11. A wireless device, comprising:

a transmitter to transmit radio frequency signals, the transmitter including:

an amplifier to receive the radio frequency signals and amplify the radio frequency signals to a power level;

a power detector to sense an output power level of the radio frequency signals amplified by the amplifier stage;

a regulating unit connected to the power detector to generate a power correction signal depending on the power level of the radio frequency signals;

a limiter connected to the regulating unit to limit a value of the power correction signal depending on a control signal which indicates a regulating range of the amplifier stage according to an operating condition of the wireless device; and a power control input for feeding a power-setting signal, the power-setting signal to regulate the amplifier during an open-loop range thereof.

12. The wireless device according to claim 11, wherein the amplifier is to operate in a closed-loop range, the power correction signal to regulate the amplifier in the closed-loop range.

* * * * *